(12) United States Patent
Homma

(10) Patent No.: US 7,382,003 B2
(45) Date of Patent: Jun. 3, 2008

(54) SOLID-STATE IMAGE PICK-UP UNIT AND METHOD OF MANUFACTURING THE SAME

(75) Inventor: Ryoichi Homma, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/374,017

(22) Filed: Mar. 14, 2006

(65) Prior Publication Data
US 2006/0220068 A1  Oct. 5, 2006

(30) Foreign Application Priority Data
Mar. 15, 2005  (JP)  ............. P. 2005-073596

(51) Int. Cl.
*H01L 27/148*  (2006.01)
*H01L 21/00*  (2006.01)
*H01L 21/339*  (2006.01)

(52) U.S. Cl. .................. 257/233; 257/E27.152; 257/222; 257/225; 438/60; 438/75; 438/144

(58) Field of Classification Search .......... 257/225, 257/222, 233, E27.152; 438/60, 75, 144
See application file for complete search history.

(56) References Cited

U.S. PATENT DOCUMENTS

| 5,302,545 | A  | * | 4/1994  | Okada et al. ............... 438/587 |
| 5,492,852 | A  | * | 2/1996  | Minami ....................... 438/60 |
| 5,589,705 | A  | * | 12/1996 | Saito et al. .................. 257/459 |
| 6,867,438 | B1 | * | 3/2005  | Maruyama et al. ......... 257/184 |
| 6,995,349 | B2 | * | 2/2006  | Suzuki .................... 250/214.1 |
| 7,033,957 | B1 | * | 4/2006  | Shiraiwa et al. ............ 438/770 |
| 2003/0170928 | A1 | * | 9/2003 | Shimozono et al. .......... 438/73 |
| 2003/0210580 | A1 | * | 11/2003 | Abe ........................... 365/200 |

FOREIGN PATENT DOCUMENTS

JP  2003-332556 A  11/2003

* cited by examiner

*Primary Examiner*—Minsun Oh Harvey
*Assistant Examiner*—Joshua King
(74) *Attorney, Agent, or Firm*—Birch, Stewart, Kolasch & Birch, LLP.

(57) ABSTRACT

A solid-state image pick-up unit comprises: a semiconductor substrate comprising an area in which a photoelectric converting portion is formed; and an electric charge transfer portion that transfers an electric charge formed by the photoelectric converting portion, wherein the electric charge transfer portion comprises: an electric charge transfer electrode including a first layer electrode and a second layer electrode; and a gate oxide film, the gate oxide film comprises a second gate oxide film formed under the second layer electrode, the second gate oxide film comprising an ONO film which comprises a SiO film, a SiN film and a SiO film in this order, and the second gate oxide film is continuously formed to cover whole of a region between the first layer electrode and the second layer electrode and a region under the second layer electrode.

15 Claims, 8 Drawing Sheets

PRIOR ART FIG. 7

SOLID-STATE IMAGE PICK-UP UNIT AND METHOD OF MANUFACTURING THE SAME

BACKGROUND OF THE INVENTION

1. Field of the Invention

The present invention relates to a solid-state image pick-up unit and a method of manufacturing the same, and more particularly to a structure of a gate oxide film.

2. Description of the Related Art

In recent years, in a solid-state image pick-up unit, an increase in the number of imaging pixels to gigapixel or more has progressed and a reduction in a width of an electrode has increasingly been promoted. In such a situation, a gap between the electrodes tends to exceed a resolution limit of photolithography and to be finer in the patterning of an electric charge transfer electrode. Accordingly, there has widely been used a method of forming and patterning a first layer conductive film to form a first layer electrode, then forming an insulating film between the electrodes around the first layer electrode, and furthermore, forming and patterning a second layer conductive film to cover the insulating film between the electrodes.

As shown in an example of a sectional structure in FIGS. 7 and 8, the related-art solid-state image pick-up unit is constituted by providing a photodiode portion and an electric charge transfer portion formed by an electric charge transfer unit (CCD) in a p well (not shown) provided on a surface of a semiconductor substrate 1, and has such a structure that an electric charge generated in the photodiode portion is led to a transfer channel formed by an n-type impurity region (not shown) by an application of a voltage to the electric charge transfer electrode of the electric charge transfer portion and is sequentially read. FIG. 8 is an enlarged view of a substantial part of an electrode portion. More specifically, in the electric charge transfer portion, the electric charge generated in the photodiode portion is led to a transfer channel and is sequentially transferred by applying a voltage to a gate electrode (an electric charge transfer electrode) (labeled 3a and 3b in the figures) to be a reading electrode serving as the electric charge transfer electrode (which will be hereinafter referred to as a reading electrode) which is formed on the transfer channel through a gate oxide film 2 having a three-layer structure including a silicon oxide film (SiO) 2a, a silicon nitride film (SiN) 2b and a silicon oxide film 2c. When a light is incident on the photodiode portion, thus, a photoelectric conversion is carried out in the n-type impurity region so that a signal charge is generated. When a reading pulse is applied to the gate electrode 3 to be the reading electrode serving as the electric charge transfer electrode, the signal charge is moved to the transfer channel. The signal charge generated in the vicinity of the surface of the substrate is accelerated through an electric field generated by the reading pulse and is thus read.

Thus, the gate oxide film formed under the electric charge transfer electrode of the solid-state image pick-up unit has a so-called ONO structure in which a silicon nitride film to be a gate having a high breakdown voltage is interposed between silicon oxide films. With this structure, a thin gate oxide film having a high breakdown voltage is indispensable to a recent solid-state image pick-up unit in which microfabrication has progressed, and the employment of the gate oxide film having the ONO structure (which will be hereinafter referred to as an ONO film) is indispensable for reducing a thickness of a gate film.

In the solid-state image pick-up unit having such a structure, in the related art, the gate oxide film 2 is formed on the surface of the substrate and the electric charge transfer electrode formed by a first layer electrode 3a and a second layer electrode 3b is formed thereon. An insulating film 4 between electrodes which is formed to cover the first layer electrode 3a is constituted by a thermal oxide film, a CVD oxide film or their laminate.

In case of a thermal oxidation, a dense film can be formed. However, it is hard to obtain a sufficient thickness of the film. If a line width is reduced with the microfabrication, moreover, an edge of a polycrystalline silicon film (amorphous silicon) constituting the first layer electrode is easily warped at a thermal oxidizing step and the polycrystalline silicon film to be a conductive film constituting the second layer electrode enters the edge portion in some cases (generation of a stringer which will be described below). In case of a CVD oxide film, a film forming speed is high and a film having sufficiently dense quality cannot be obtained. In further microfabrication of a unit, accordingly, it is hard to obtain a sufficient breakdown voltage with the oxide film and there is a possibility that an electric field might converge on the edge.

Moreover, the gate oxide film has the ONO structure. Therefore, the insulating film between the first layer electrode and the second layer electrode is silicon oxide, while the gate oxide film in a lower layer portion has the ONO structure. In some cases, a film portion of poor quality is formed in the vicinity of a boundary surface of the insulating film between the electrodes which is formed of the silicon oxide and the gate oxide film, and a leakage between the electrodes is caused therein.

In some cases, furthermore, a second layer conductive film for constituting the second layer electrode 3b is provided around the lower part of the first layer electrode 3a and remains as a stringer. For this reason, there is a problem in that the first layer electrode 3a and the second layer electrode 3b in an adjacent cell are connected to each other through the stringer S and a DC short circuit is generated easily. There is a problem in that polycrystalline silicon is removed due to the overetch of the stringer.

Moreover, so-called hydrogen annealing in which a dark current in a photodiode portion is suppressed in order to enhance an initial characteristic and a heat treatment is carried out with the sufficient supply of hydrogen in order to stabilize the characteristic is a very important part for stabilizing the initial characteristic of a unit (JP-A-2003-332556). Therefore, two layers provided on an ONO film over the photodiode, that is, layers provided up to a silicon nitride film are removed to leave a single layer film, thereby forming a passage for the hydrogen. There is employed a method of forming silicon nitride as an antireflection film on the photodiode again after the hydrogen treatment.

On the other hand, a signal charge generated in the vicinity of the surface of the substrate is accelerated with an electric field through a reading pulse. When the signal charge is to be read, a part thereof becomes a hot carrier and is trapped into a silicon nitride film, thereby causing the aging of a reading gate voltage.

In particular, a gate length is reduced when the microfabrication of a unit progresses. For this reason, there is a tendency that the number of collisions of an electron is decreased and the frequency of the generation of the hot carrier is increased. The aging of a voltage to be applied to the reading gate has become serious.

When the microfabrication of a CCD progresses, thus, the ONO film to be the gate oxide film also has a thickness reduced. However, an applied voltage is higher in the CCD as compared with a logic system device. For this reason, there is a problem in that the influence of the hot carrier is great.

In the related-art solid-state image pick-up unit, thus, there is a problem in that a breakdown voltage is not sufficient, that is, an edge convergence on an upper edge of a first layer electrode is caused or a short circuit is caused by a stringer on a lower edge of the first layer electrode with a demand for reducing a thickness of an insulating film between electrodes. In order to implement a gate structure in which a thickness can be reduced with a high breakdown voltage and hydrogen annealing for enhancing an initial characteristic, moreover, it is necessary to subsequently form a hole on a silicon nitride film of a gate oxide film or to once form an opening on the silicon nitride film, thereby carrying out the formation again. In addition, the aging of the hot carrier is not generated in the gate structure. Thus, an enhancement in the quality of the gate oxide film has become a serious problem.

SUMMARY OF THE INVENTION

In consideration of the actual circumstances, it is an object of the invention to provide a solid-state image pick-up unit having a high breakdown voltage which can prevent an interlayer leakage between a first layer electrode and a second layer electrode also in the microfabrication of an insulating film between electrodes, and has a stability, a high reliability and a small thickness.

Moreover, it is an object of the invention to provide a method of manufacturing a solid-state image pick-up unit which can easily be manufactured and has a high reliability.

The invention provides a solid-state image pick-up unit comprising: a semiconductor substrate comprising an area in which a photoelectric converting portion is formed; and an electric charge transfer portion that transfers an electric charge formed in the photoelectric converting portion, the electric charge transfer portion being formed in the semiconductor substrate, wherein an electric charge transfer electrode for the electric charge transfer portion comprises a first layer electrode and a second layer electrode; a gate oxide film under the second layer electrode comprises a lamination structure (ONO) film which comprises: a bottom oxide film of a silicon oxide (SiO) film provided on a surface of the semiconductor substrate; a silicon nitride (SiN) film formed on the bottom oxide film; and a top oxide film of a silicon oxide (SiO) film provided on the silicon nitride film, and the ONO film is extended from a region under the second layer electrode to a region between the first layer electrode and the second layer electrode, so as to cover whole of the regions.

According to the structure, the gate oxide film is constituted with the ONO film structure formed continuously to cover the whole region between the first layer electrode and the second layer electrode under the second layer electrode. Therefore, a portion having poor film quality is not generated in the vicinity of a boundary surface of the insulating film between the electrodes and the gate oxide film so that it is possible to prevent a leakage between the electrodes from being generated and to hinder the edge convergence of an electric field from being generated on an upper edge of the first layer electrode, thereby forming a gate oxide film having a high reliability. Prior to the formation of the second layer electrode, moreover, the gate oxide film having the ONO structure is formed on the first layer electrode. Therefore, a stringer generating portion is guarded firmly so that it is possible to prevent the conductive film constituting the second layer electrode from being provided around to remain as a stringer. Accordingly, it is possible to prevent the generation of a DC short circuit.

The invention provides the solid-state image pick-up unit, wherein the gate oxide film under the first layer electrode comprises the ONO film, the second layer electrode is formed to partially overlap with the first layer electrode when viewed from a vertical direction to the surface of the semiconductor substrate, and the ONO film covers a surface portion, other than that exposed from the second layer electrode, of the first layer.

By this structure, the first layer electrode and the second layer structure are constituted to have the same characteristic and a passage for hydrogen is formed in hydrogen annealing. Therefore, it is possible to provide a solid-state image pick-up unit having an excellent initial characteristic.

Moreover, the invention provides the solid-state image pick-up unit, wherein the ONO film is not formed on a region reaching a surface, on the area in which the photoelectric converting portion is formed, of the semiconductor substrate from an end face of the first layer electrode.

By this structure, there is formed a region from which the ONO film is removed in a direction which is not resistant to a smear. In this direction, consequently, a shielding film is formed earlier in a deep position. Thus, it is possible to improve the smear.

Furthermore, the invention provides the solid-state image pick-up unit, wherein the silicon nitride film of the ONO film under the second layer electrode covers a surface, on the area in which the photoelectric converting portion is formed, of the semiconductor substrate, so that the silicon nitride film serves as an antireflection film on the photoelectric converting portion.

By this structure, the silicon nitride film constituting the ONO film can be exactly used as the antireflection film and a film does not need to be formed again. Therefore, the process can be simplified.

In addition, the invention provides the solid-state image pick-up unit, wherein a shielding film is formed to cover the electric charge transfer portion, and a lower end of the shielding film is formed to reach a level which is closer to the surface of the substrate than lower ends of the first and second layer electrodes.

By this structure, the shielding film is formed in the deep position. Consequently, it is possible to improve the smear.

Moreover, the invention provides the solid-state image pick-up unit, wherein the bottom oxide film includes a thermal oxide film formed on the surface of the semiconductor substrate and subjected to a nitriding treatment, and a CVD oxide film formed thereon.

According to such a structure, a silicon oxynitride film subjected to the nitriding treatment is used for the silicon oxide film positioned on the semiconductor substrate in the gate oxide film. Also in the case in which the gate oxide film is thick, therefore, a bottom oxide film is sufficiently nitrided. Accordingly, the silicon oxynitride film to be a lowermost layer can reliably block a hot carrier and can prevent the hot carrier from reaching the silicon nitride film. According to the structure, thus, a hot carrier blocking advantage can be increased and the hot carrier can be blocked by the bottom oxide film even if a signal charge generated in the vicinity of the surface of the substrate becomes the hot carrier. Therefore, the hot carrier reaches the silicon nitride film with difficulty and is rarely trapped into the silicon nitride. Accordingly, it is possible to lessen the trap of the hot carrier into the silicon nitride film and to maintain an excellent reading characteristic without causing the aging of a voltage applied to a reading gate.

Moreover, nitrogen is unevenly distributed over an interface of the substrate and the bottom oxide film. Therefore, it is possible to suppress the diffusion of an impurity in the substrate into the gate oxide film and that of the impurity from the gate oxide from into the substrate.

It is desirable that the film having the lamination structure is the film having the ONO structure in which the silicon nitride film is provided in the silicon oxide. In case of the film having the ONO structure, a nitrogen ion does not reach the bottom oxide film even if the nitriding treatment is carried out. For this reason, it is impossible to obtain the sufficient hot carrier blocking effect. By using the oxynitride film as the bottom oxide film as in the structure according to the invention, however, it is possible to obtain the sufficient hot carrier blocking effect by the bottom oxide film. Moreover, the film having the ONO structure is used. Consequently, it is possible to raise a breakdown voltage more greatly.

Furthermore, the invention provides the solid-state image pick-up unit, wherein the bottom oxide film includes a thermal oxide film formed on the surface of the semiconductor substrate and subjected to a nitriding treatment.

By this structure, it is possible to form a denser film having a higher reliability in which impurities are lessened and to reduce a possibility that the substrate might be contaminated with the impurity in the bottom oxide film, thereby enhancing the reliability.

Moreover, a denser bottom oxide film can be obtained. Therefore, it is possible to further enhance the effect of suppressing the diffusion of the impurity in the substrate into the gate oxide film and the diffusion of the impurity from the gate oxide film to the substrate.

Furthermore, the bottom oxide film may include a thermal oxide film formed on the surface of the semiconductor substrate and subjected to a nitriding treatment, and a CVD oxide film formed thereon. Consequently, it is possible to form a film on the upper layer side at a low temperature. Also in the case in which the bottom oxide film is to be thickened, accordingly, it is possible to prevent the diffusion of the nitrogen from being promoted at the step of forming the CVD oxide film. Therefore, it is possible to prevent the diffusion of the nitrogen into the substrate and to hold the nitrogen on the interface of the bottom oxide film and the substrate, thereby enhancing the effect of blocking the impurity on the interface.

In addition, the invention provides the solid-state image pick-up unit, wherein the thermal oxide film subjected to the nitriding treatment has a thickness of 10 nm or less.

If the film has such a thickness, it is possible to sufficiently supply the nitrogen to the interface of the substrate by a heat treatment in an atmosphere containing the nitrogen.

Moreover, it is desirable that the thermal oxide film subjected to the nitriding treatment should have a thickness of 5 nm or more if the whole gate oxide film has a thickness of 80 nm or more. The reason is that the hot carrier blocking effect cannot be exhibited sufficiently if the thermal oxide film has a thickness which is smaller than 5 nm.

Furthermore, it is desirable that the thermal oxide film subjected to the nitriding treatment should have a thickness of 8% of the thickness of the whole gate oxide film or more. The reason is that the hot carrier blocking effect cannot be exhibited sufficiently if the thickness is smaller than 8%.

The bottom oxide film may comprises a CVD oxide film comprising nitrogen and formed on the surface of the semiconductor substrate. Consequently, it is possible to form a film at a low temperature and to reliably inject the nitrogen into the oxide film.

The invention provides a method of manufacturing a solid-state image pick-up unit, which forms, on a semiconductor substrate comprising an area in which photoelectric converting portion is formed, an electric charge transfer portion that transfers an electric charge formed by the photoelectric converting portion, the method comprising a step of forming gate oxide films of the electric charge transfer portion on the semiconductor substrate comprising the steps of: sequentially laminating, on a surface of the semiconductor substrate, a bottom oxide film of a silicon oxide (SiO) film, a silicon nitride (SiN) film formed on the bottom oxide film and a top oxide film of a silicon oxide (SiO) film formed on the silicon nitride film, to form a first lamination structure (ONO) film; forming a first layer conductive film on the first ONO film and patterning the first layer conductive film to form a first layer electrode; sequentially laminating, on the first layer electrode, a bottom oxide film of a silicon oxide (SiO) film, a silicon nitride (SiN) film formed on the bottom oxide film, and a top oxide film of a silicon oxide (SiO) film provided on the silicon nitride film, to form a second lamination structure (ONO) film; and forming a second layer conductive film on the second ONO film and patterning the second layer conductive film, to form a second layer electrode.

According to such a method, the ONO process is divided for the first layer electrode and the second layer electrode, thereby carrying out the formation. Consequently, it is possible to prevent the second layer electrode from entering the edge of the first layer electrode, thereby suppressing the generation of a stringer. By dividing the ONO process into two parts, moreover, it is possible to form a passage for hydrogen in the hydrogen annealing. Therefore, the photoelectric converting portion is covered with an antireflection film. Accordingly, the antireflection film does not need to be newly formed in the photoelectric converting portion and an excellent workability can be obtained, and furthermore, the contamination of etching can be prevented and a pure antireflection film having a high transparency can be maintained. By forming the silicon oxide film containing nitrogen as the bottom oxide film, moreover, it is possible to form a dense bottom oxide film having a high hot carrier blocking effect also in the case in which a solid-state image pick-up unit having a high breakdown voltage is formed.

Moreover, the method according to the invention further comprises the step of selectively removing the second ONO film after the step of forming the second layer electrode.

By this structure, the second ONO film in an unnecessary portion is removed selectively. Consequently, it is possible to maintain the passage for the hydrogen in the hydrogen annealing, and furthermore, to reduce a height of the electric charge transfer portion.

In the method according to the invention, the selective removing step comprises the step of removing the second ONO film so as to remain at least the silicon nitride film of the second ONO film on a surface, on the area in which the photoelectric converting portion is formed, of the semiconductor substrate.

According to this structure, the silicon nitride film can be exactly used as the antireflection film.

In the method according to the invention, the selective removing step comprises: the step of removing the second ONO film along a peripheral edge of a surface, on the area in which the photoelectric converting portion is formed, of the semiconductor substrate; and the step of forming a shielding film to enter the peripheral edge from which the second ONO film is removed.

According to this structure, the shielding film can be formed in a very close position to the surface of the substrate. Therefore, the structure is very effective for improving a smear.

It is desirable that the bottom oxide film forming step should include the steps of forming a silicon oxide film, and annealing the silicon oxide film in a nitrogen atmosphere and forming an oxynitride film.

According to the structure, it is sufficient that the bottom oxide film is subjected to the nitriding treatment in the nitrogen atmosphere. Therefore, manufacture can also be carried out easily. The oxynitride film can also be formed by a thermal oxidation in a nitrogen suboxide ($N_2O$) atmosphere.

It is desirable that the step of forming a silicon oxide film should use the thermal oxidizing step. Therefore, it is possible to obtain a dense bottom oxide film of high quality.

If the step of forming a silicon oxide film includes the step of forming a silicon oxide film by a CVD method, the formation can be carried out at a lower temperature.

If the step of forming a silicon oxide film includes the step of forming a silicon oxide film by a thermal oxidation, carrying out annealing in a nitrogen atmosphere, and then forming a silicon oxide film by a CVD method, moreover, it is possible to obtain a very dense bottom oxide film having a high reliability.

The CVD process is carried out at a low temperature. Therefore, it is possible to prevent the nitrogen from being diffused into the substrate at the step of forming a silicon oxide film and to obtain a bottom oxide film having a great thickness.

According to the method in accordance with the invention, thus, it is possible to prevent the trap of the hot carrier and to obtain a solid-state image pick-up unit having a high breakdown voltage.

Moreover, it is desirable that the gate oxide film provided under the reading gate electrode should have a single layer structure. Consequently, the silicon nitride film is removed perfectly under the reading gate electrode. Therefore, the trap of the hot carrier is not carried out at all.

DETAILED DESCRIPTION OF THE INVENTION

Embodiments of the invention will be described below with reference to the drawings.

First Embodiment

Figure 1:
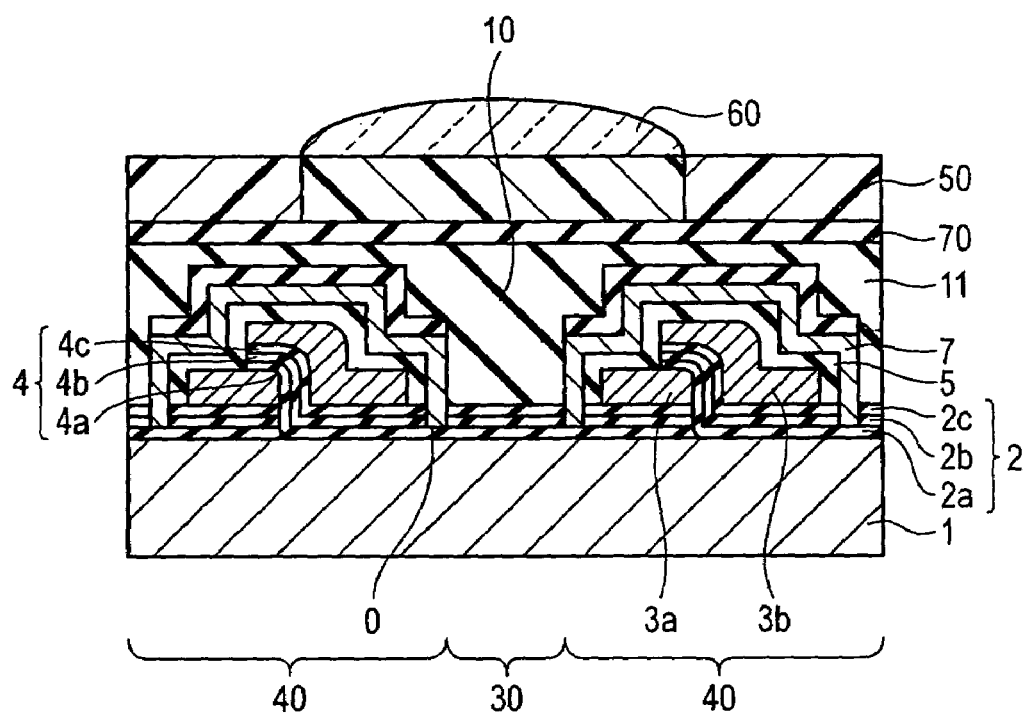
FIG. 1 is a sectional view showing a solid-state image pick-up unit according to a first embodiment of the invention.

As shown in a schematic sectional view of FIG. 1, a solid-state image pick-up unit is characterized in that an electric charge transfer electrode formed on a silicon substrate 1 is constituted by a first layer electrode 3a and a second layer electrode 3b and an ONO film constituting a gate oxide film is formed by a division for a first layer electrode and a second layer electrode and is provided continuously to cover a whole region between the first layer electrode and the second layer electrode under the second layer electrode, thereby preventing a leakage between the first layer electrode and the second layer electrode, to suppress the generation of a stringer and to prevent a DC short circuit. More specifically, a gate electrode 3a, 3b to be an electric charge transfer electrode constituted by a doped amorphous silicon film is formed through a gate oxide film having an ONO structure on the surface of the silicon substrate 1, and the gate oxide film is constituted by a lamination structure film (ONO film) including a bottom oxide film 2a formed by a silicon oxide film subjected to a nitriding treatment, a silicon nitride film 2b formed on the bottom oxide film 2a and a top oxide film 2c formed by a silicon oxide film provided on the silicon nitride film 2b, and a hot carrier can be prevented from reaching the silicon nitride film 2b. The bottom oxide film 2a has a thickness of 10 nm, the silicon nitride film 2b has a thickness of 50 nm and the top oxide film 2c has a thickness of 8 nm.

Figure 2:
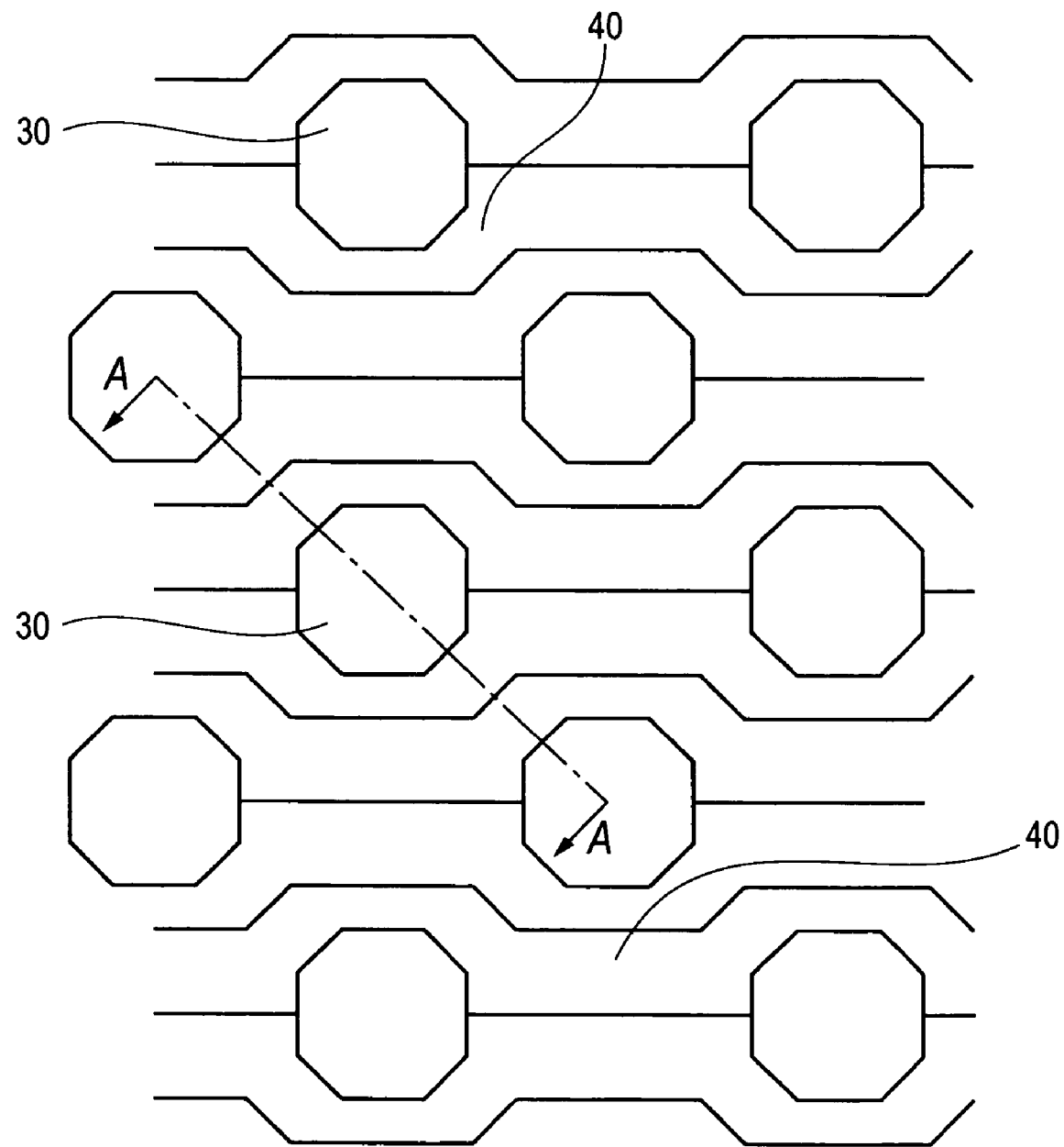
FIG. 2 is a plan view showing the solid-state image pick-up unit according to the first embodiment of the invention.

FIG. 1 is a sectional view showing a main part of the solid-state image pick-up unit and FIG. 2 is a plan view. In the solid-state image pick-up unit, a p well (not shown) and an n-type semiconductor layer (not shown) are formed on a surface of an element region isolated through an element isolating region. A plurality of electric charge transfer electrodes 3 (3a, 3b) arranged through the gate oxide film 2 is formed on the surface of the silicon substrate 1 by a division through a gate oxide film 4 (4a, 4b, 4c) constituted by the ONO film formed continuously in the same process as the gate oxide film 2 in order to reach the first layer electrode 3a from the surface of the substrate and is covered with a shielding film 7 having an opening in a light receiving region of a photodiode 30 to be a photoelectric converting portion, and the opening portion is covered with a translucent film 10 formed by a film having a high refractive index with a columnar structure constituted by silicon nitride and a silicon nitride film formed thereon. As shown in embodiment depicted in FIG. 1, the second layer electrode 3b is formed on a side surface of the first layer electrode 3a and a portion of a top surface of electrode 3a, but not the remaining portion of the top surface of first electrode layer 3a or a side surface of the first electrode layer 3a opposed to the side surface of the first layer electrode 3a on which the second layer electrode 3b is formed. The ONO film is removed from a region reaching the photoelectric converting portion side from an end face of the first layer electrode to form a stepped portion O. In the embodiment depicted in FIG. 1, the ONO film has been removed from the remaining portion of the top surface of first electrode layer 3a on which the second electrode layer 3b is not formed and the side surface of the first electrode layer 3a that is opposed to the side surface of the first layer electrode 3a on which the second layer electrode 3b is formed. The shielding film 7 is formed so that its end face enters in the stepped portion O. Due to this, the lower end of the shielding film 7 is formed to have a depth which is closer to the surface of the silicone substrate, thereby covering the electric charge transfer portion to improve smear. 11 denotes a flattened film constituted by a BPSG film.

The translucent film 10 is covered with the flattened film 70 constituted by a translucent organic film.

A plurality of photodiodes 30 (photoelectric converting portion) is formed in the silicon substrate 1 and an electric charge transfer portion 40 for transferring a signal charge detected by the photodiode is formed to take a meandering shape together with the photodiode 30. An electric charge transfer channel through which the signal charge to be transferred by the electric charge transfer portion 40 is moved is also formed to take the meandering shape in a direction crossing a direction in which the electric charge transfer portion 40 is extended, which is not shown.

The photodiode 30 having a pn junction, the electric charge transfer channel, a channel stop region and an electric charge reading region are formed in the silicon substrate 1 provided with the p well.

In the electric charge transfer portion 40, moreover, the gate oxide film 2 having the ONO structure is formed on the surface of the silicon substrate 1. A first electrode formed by the first layer doped amorphous silicon film 3a constituting the electric charge transfer electrode is formed on the surface of the gate oxide film 2, and furthermore, a second electrode formed by the second layer doped amorphous silicon film 3b is laminated through a gate oxide film (an insulating film between electrodes) 4 formed by the ONO film so that a multilayer electrode structure is obtained.

A TEOS film 6 having a thickness of 30 nm is formed on the second electrode through a silicon oxide film 5. The thin tungsten film 7 having a thickness of 200 nm is formed as a shielding layer thereon through a titanium nitride layer (not shown) having a thickness of 50 nm formed by sputtering.

Thus, the shielding film 7 having the opening formed in a region corresponding to the photodiode 30 is provided in the upper part of the solid-state image pick-up unit, and the translucent film 10 to be the film having a high refractive index is formed like a column in the photodiode region through a flattened film 11 constituted by the BPSG film. A color filter 50 and a microlens 60 are provided thereon through an in-layer convex lens and the flattened film 70.

Next, description will be given to the steps of forming the electric charge transfer electrode in a process for manufacturing the solid-state image pick-up unit with reference to FIGS. 3A to 3C, FIGS. 4A to 4C and FIGS. 5A to 5c. In this example, in order to provide an n-type impurity region and a p-type impurity diffusion region for forming the photodiode region and an n-type impurity region to be a transfer channel, an ion is implanted and a gate oxide film and a gate electrode are then formed. At this time, it is necessary to set a time required for a diffusion on the assumption that a diffusion length is increased by heating in a subsequent process. In the following steps, for simplicity, the photodiode region and the transfer channel which are to be formed in the semiconductor substrate are omitted.

First of all, the silicon oxide film 2a having a thickness of 25 nm is formed by a thermal oxidation in a p well formed on the surface of the n-type silicon substrate 1. Herein, an oxidation is carried out by heating to 950° C. in an atmosphere of $HCl/O_2$=1 slm/10 slm.

Then, the silicon nitride film 2b having a thickness of 50 nm is formed on the bottom oxide film 2a by a CVD method. For conditions of a deposition, 780° C. is set in an atmosphere of $SiH_2Cl_2/NH_3$=0.09 slm/0.9 slm (0.5 Torr).

Figure 3A:
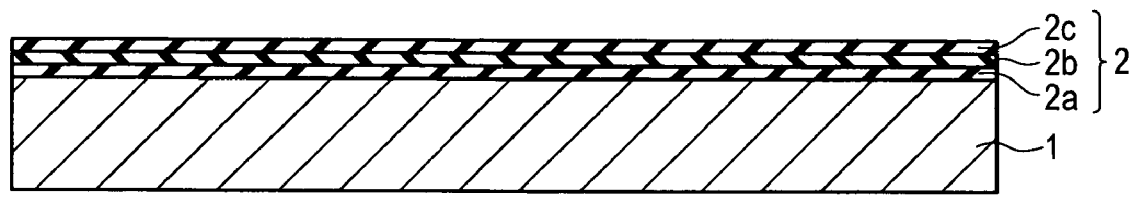
FIGS. 3A to 3C are views showing a process for manufacturing the solid-state image pick-up unit according to the first embodiment of the invention.

By the CVD method, furthermore, a silicon oxide film having a thickness of 8 nm is formed as the top oxide film 2c on the silicon nitride film 2b, and a gate oxide film having a three-layer structure is formed (FIG. 3A). For CVD conditions, 800° C. is set in an atmosphere of $SiH_4/H_2O$=0.05 slm/2.5 μm (1.2 Torr). The top oxide film can also be formed by a thermal oxidation ($H_2/O_2$, 950° C.) with silicon nitride oxidized slightly.

Figure 3B:
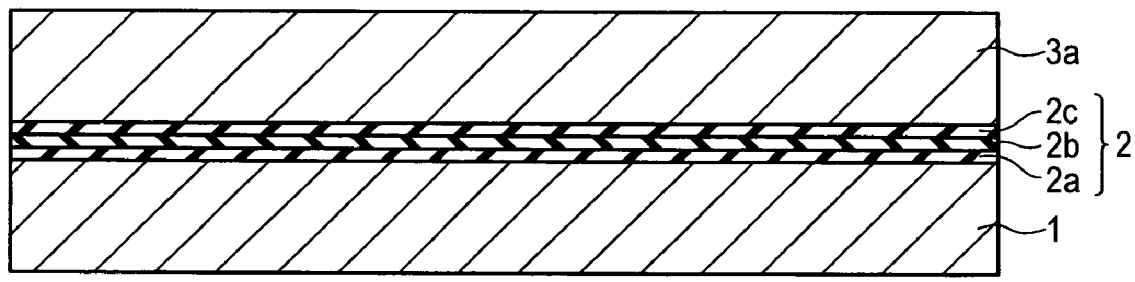

Subsequently, a doped amorphous silicon layer for forming the first layer electrode 3a is provided on the gate oxide film 2 (FIG. 3B).

More specifically, the first layer doped amorphous silicon film 3a having a thickness of 0.4 μm and doped with phosphorus is formed on the gate oxide film 2 by a low pressure CVD method using, as a reactive gas, $SiH_4$ having $PH_3$ and $N_2$ added thereto. At this time, the substrate has a temperature of 600 to 700° C.

Figure 3C:
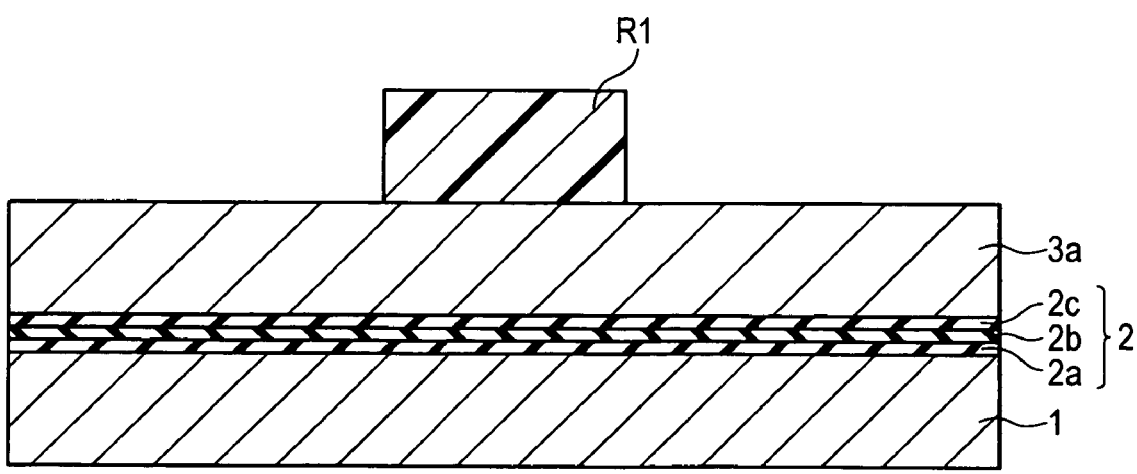

Subsequently, a resist R1 is applied to form a resist pattern for forming the first layer electrode (FIG. 3C).

Figure 4A:
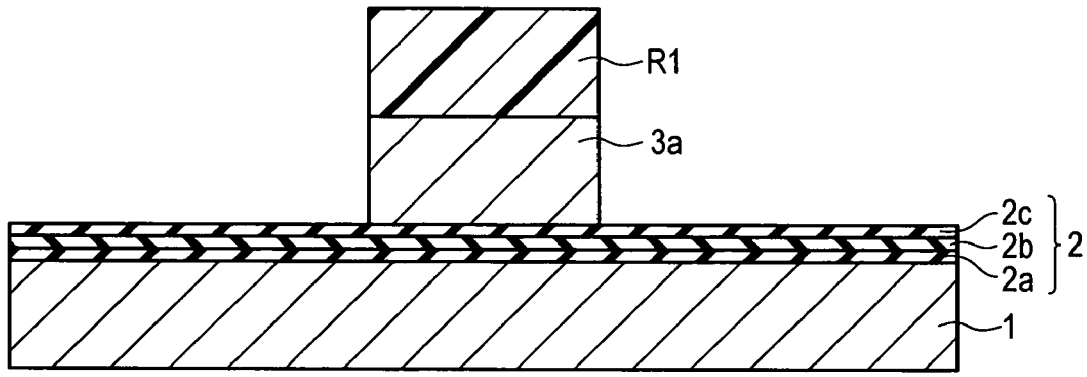
FIGS. 4A to 4C are views showing the process for manufacturing the solid-state image pick-up unit according to the first embodiment of the invention.

Then, the first layer doped amorphous silicon film is etched by using the resist pattern R1 as a mask, thereby forming the first layer electrode 3a (FIG. 4A). At this time, the first layer doped amorphous silicon film 3a is selectively etched and removed by using the mask pattern as a mask and the silicon nitride film 2b of the gate oxide film 2 as an etching stopper through reactive ion etching using a mixed gas of HBr and $O_2$ so that a first electrode and wirings of a peripheral circuit are formed. Herein, it is desirable that an etching device using an ECR (Electron Cyclotron Resonance) method or an ICP (Inductively Coupled Plasma) method should be used.

Figure 4B:
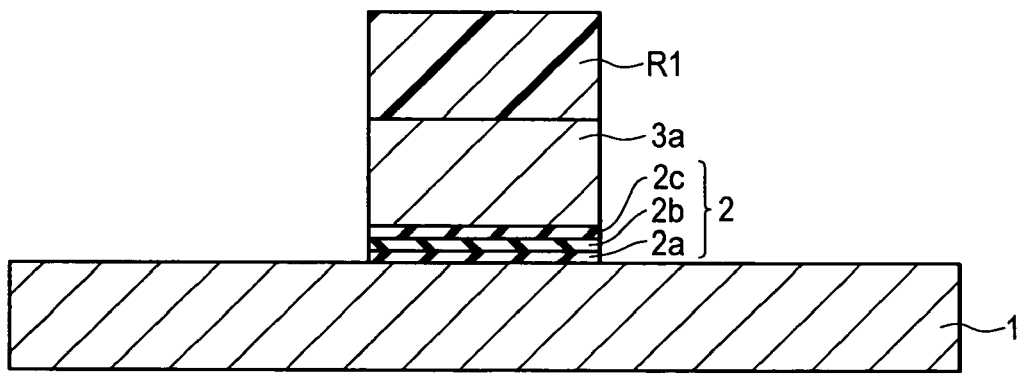

Subsequently, the gate oxide film 2 is etched and removed by using the first layer electrode 3a as a mask (FIG. 4B).

Figure 4C:
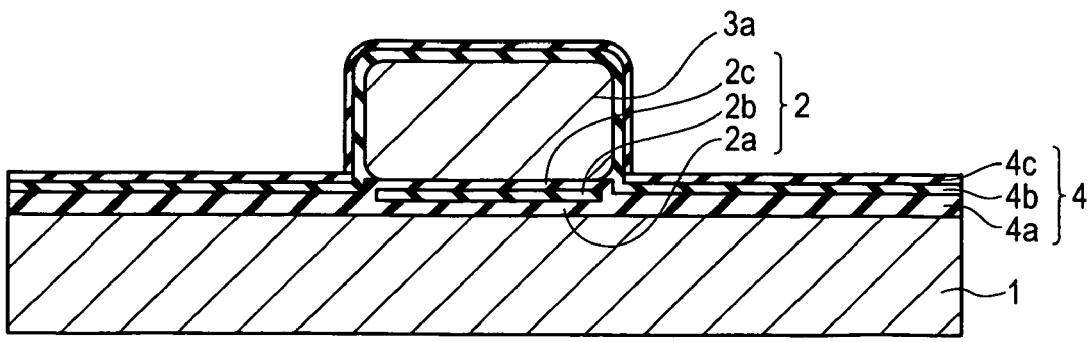

Thereafter, the gate oxide film (the insulating film between electrodes) 4 constituted by an ONO film is formed over the whole surface of the substrate including the first layer electrode 3a in the same process as the gate oxide film 2 (FIG. 4C). The gate oxide film is formed in the same manner as the gate oxide film 2 and is constituted by the bottom oxide film 4a, the silicon nitride film 4b and the top oxide film 4c. A thickness is also the same as that of each layer in the gate oxide film 2.

More specifically, the second layer doped amorphous silicon film 3b having a thickness of 0.4 μm and doped with phosphorus is formed on the gate oxide film 4 by a low pressure CVD method using, as a reactive gas, $SiH_4$ having $PH_3$ and $N_2$ Added thereto. At this time, the temperature of the substrate is set to be 600 to 700° C.

Figure 5A:
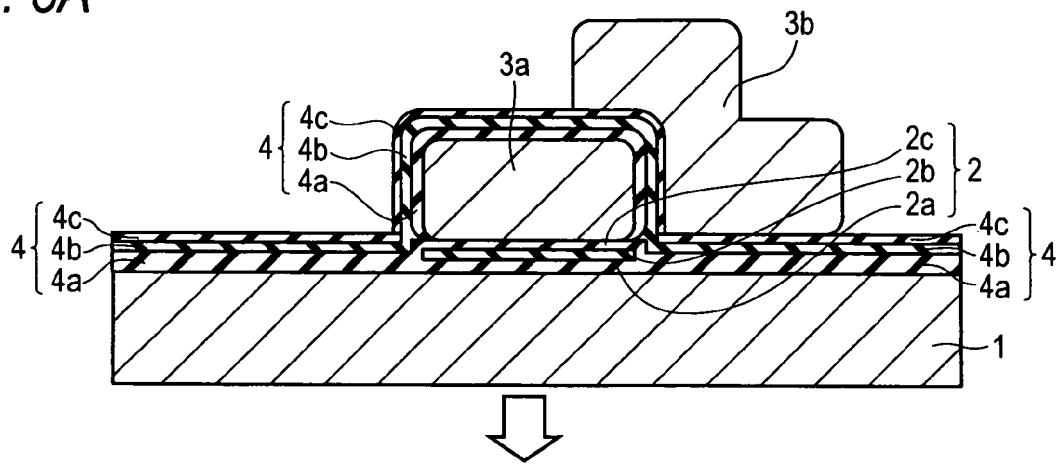
FIGS. 5A to 5C are views showing the process for manufacturing the solid-state image pick-up unit according to the first embodiment of the invention.

Subsequently, a positive photoresist is applied thereto in a thickness of 0.5 to 1.4 μm and exposure is then carried out by using a desirable mask by photolithography, and development and rinsing are performed to pattern the second layer doped amorphous silicon film 3b, thereby forming the second layer electrode 3b (FIG. 5A). Thereafter, the resist pattern is peeled and removed by ashing. At this time, the gate oxide film 4 in the peripheral edge portion of the photodiode region is removed selectively. The layers provided up to the silicon nitride 4b may be removed to leave the bottom oxide film 4a.

Figure 5B:
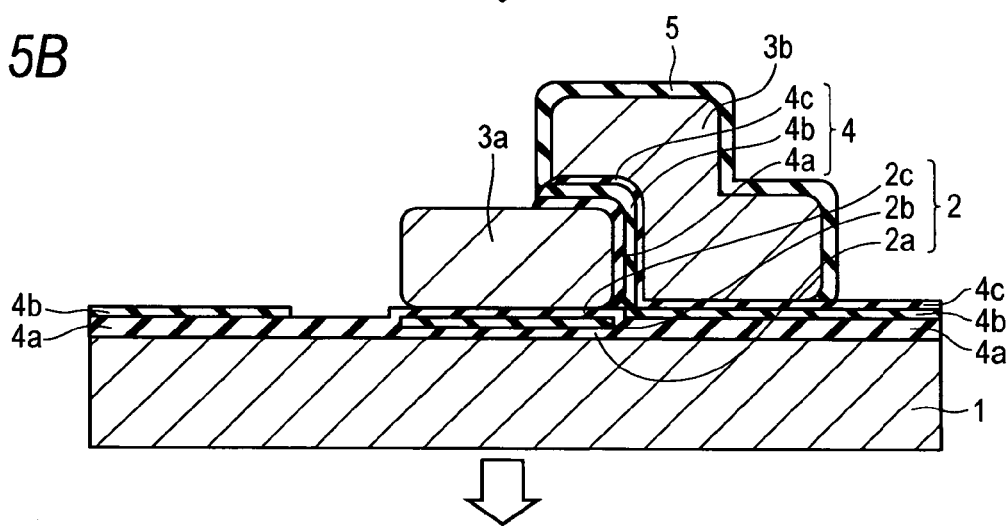

Then, the insulating film 5 formed of a silicon oxide film having a thickness of 70 nm is formed on the second layer electrode by a thermal oxidation method (FIG. 5B).

Figure 5C:
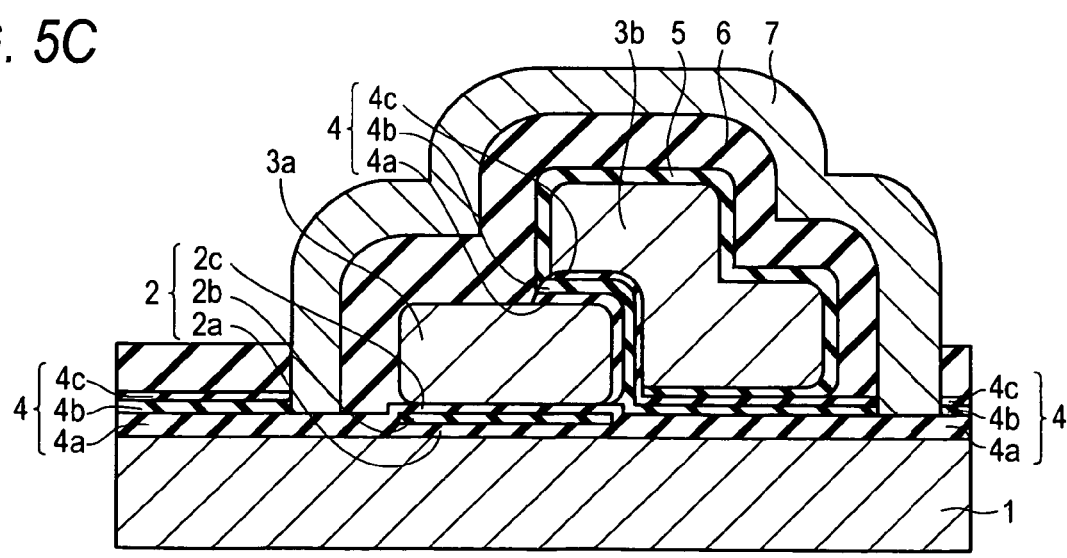

Thereafter, the TEOS film 6 is formed thereon and the tungsten film is formed as the shielding film 7 through TiN (not shown) to be an adhesive layer, and the pattern of the shielding film 7 is subjected to the pattering together with the insulating film by using the resist pattern as a mask (FIG. 5C). Since the gate oxide film 4 in the peripheral edge portion of the photodiode region is removed selectively to form a groove-like concave portion O, the shielding film 7 provided thereon as an upper layer is formed so as to enter into the groove-like concave portion O. As a result, the shielding film 7 covers the electric charge transfer portion to prevent stray light.

The BPSG film having a thickness of 700 nm is formed through a silicon nitride film (not shown) (FIG. 5A) on the shield film 7 thus formed and is flattened by a reflow at 850° C. so that the flattened film 11 is formed. Then, the flattened film 11 provided on the photodiode region is selectively removed by the photolithography and the translucent film 10 formed of the BPSG film having a high refractive index is provided in the region subjected to the removal.

Finally, the flattened layer 70, the filter layer 50 and the lens 60 are provided so that the solid-state image pick-up unit shown in FIG. 1 is formed.

According to the solid-state image pick-up unit thus formed, the gate oxide film is formed separately under the first layer electrode and the second layer electrode and is formed continuously over the first layer electrode under the second layer electrode. Therefore, the gate oxide film is constituted with the ONO film structure formed continuously to cover the whole region between the first layer electrode and the second layer electrode. Therefore, a portion having poor film quality is generated in the vicinity of a boundary surface between the insulating film between the electrodes and the gate oxide film so that it is possible to prevent a leakage between the electrodes from being generated. Moreover, it is possible to hinder the edge convergence of an electric field from being generated on an upper edge of the first layer electrode, thereby forming a gate oxide film having a high reliability.

Prior to the formation of the second layer electrode, moreover, the gate oxide film having the ONO structure is formed on the first layer electrode. Therefore, a stringer generating portion is guarded firmly so that it is possible to prevent the conductive film constituting the second layer electrode from being provided around to remain as a stringer. Accordingly, it is possible to prevent the generation of a DC short circuit.

Furthermore, there is a region in which the silicon nitride film is not present. Even if the photodiode region, that is, the silicon nitride film provided on the photoelectric converting portion is not removed, therefore, a passage for hydrogen annealing can be maintained. Consequently, it is not necessary to newly form an antireflection film so that a producing workability can be enhanced, and furthermore, a reliability can be improved.

In addition, the shielding film 7 is formed in a deep region from which the silicon nitride 4b is removed. Therefore, a smear can be prevented more reliably.

Moreover, the first layer electrode is oxidized so that the bottom oxide film is formed and the silicon nitride film is then formed by the CVD method. Consequently, it is possible to prevent the stringer from being formed due to the entrance of the silicon nitride film under the edge of the first layer electrode.

When the bottom oxide film is constituted by the silicon oxynitride film in this structure, furthermore, a signal charge generated in the vicinity of the surface of the substrate is blocked by the bottom oxide film even if it becomes a hot carrier. Therefore, the hot carrier does not reach the silicon nitride film 2b of the ONO film and is rarely trapped. Accordingly, it is possible to maintain an excellent reading characteristic without causing the aging of a reading gate voltage.

Since the bottom oxide film is constituted by the thermal oxide film subjected to the nitriding treatment, furthermore, it can be a denser film having a higher reliability in which impurities thereof are lessened. Thus, it is also possible to reduce a possibility that the substrate might be contaminated with the impurities in the bottom oxide film. Thus, the reliability can be enhanced.

As described above, moreover, it is possible to obtain a denser bottom oxide film. Therefore, it is possible to enhance the effect of suppressing the diffusion of the impurity in the substrate into the gate oxide film and the diffusion of the impurity from the gate oxide film to the substrate.

It is desirable that the bottom oxide film should have a thickness of 2 to 10 nm. With such a thickness, moreover, it is possible to sufficiently supply nitrogen to an interface with the substrate by a heat treatment in the nitrogen atmosphere.

By setting the silicon nitride film to have a thickness of approximately 5 to 50 nm, it is possible to effectively function as an oxidizing stopper.

By setting the bottom oxide film to have a thickness of 2 to 50 nm, furthermore, it is possible to suppress the injection of an electric charge from the substrate.

Moreover, it is possible to carry out the formation without a special step.

While the bottom oxide film is constituted by the silicon oxynitride film to be a single layer which is obtained by annealing the thermal oxide film in the nitrogen atmosphere in the first embodiment, the silicon oxynitride film may be formed and the CVD oxide film may be then formed thereon, and the bottom oxide film may be constituted by these two layers.

The description has been given to the case in which the electric charge transfer electrode having the two-layer electrode structure is used in the first embodiment. It is apparent that the invention can also be applied to the case in which a conductive film having a two-layer structure is formed and an electric charge transfer electrode having a single layer electrode structure is then formed by a flattening treatment.

Second Embodiment

While the ONO film is provided under the first layer electrode and the second layer electrode in the first embodiment, the ONO film is not restricted but argon OAO may be used.

Third Embodiment

Figure 6:
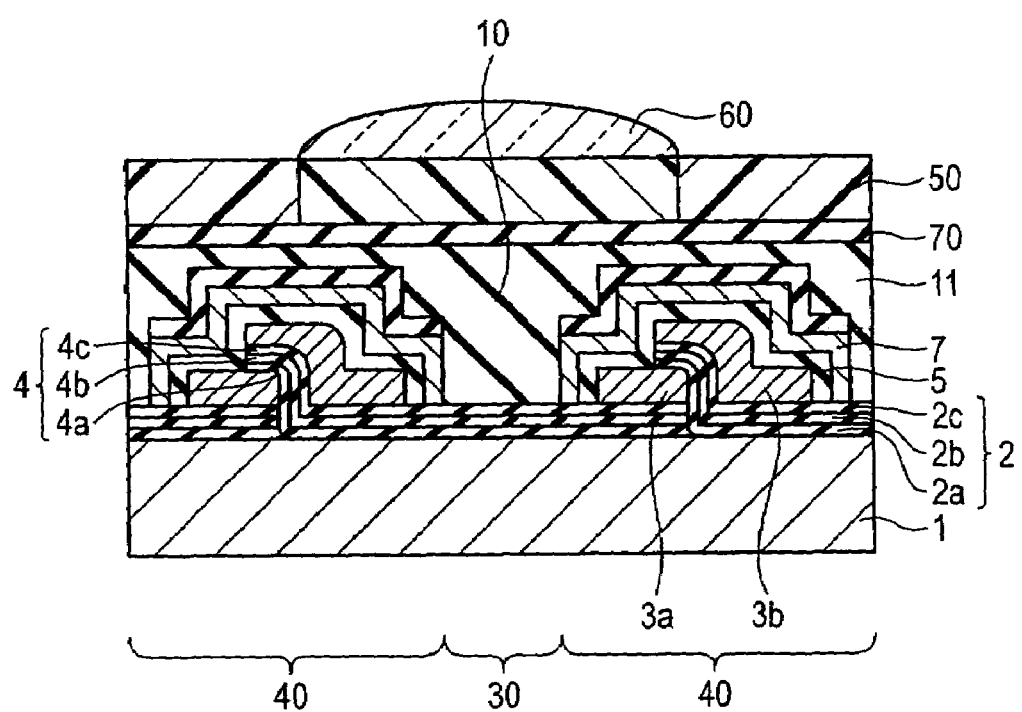
FIG. 6 is a view showing a solid-state image pick-up unit according to a second embodiment of the invention.
Figure 7:
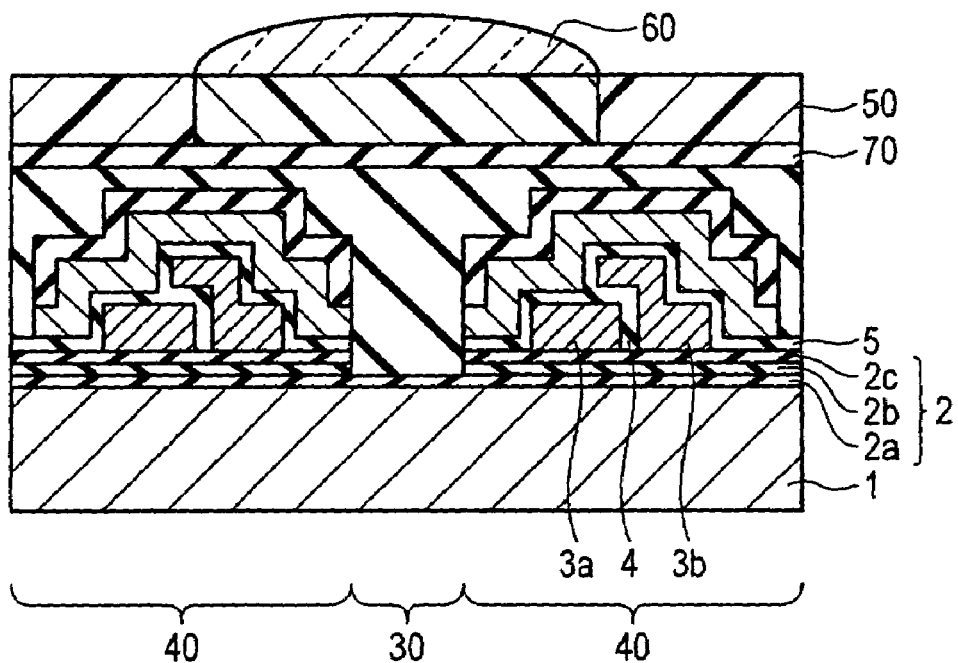
FIG. 7 is a view showing a solid-state image pick-up unit according to the related-art example.
Figure 8:
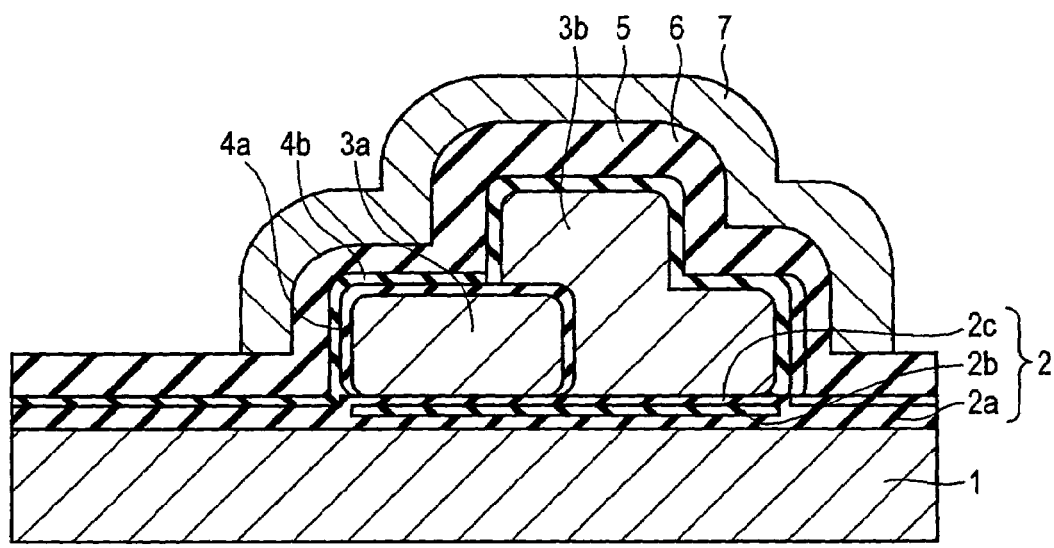
FIG. 8 is a view showing the solid-state image pick-up unit according to the related-art example.

While the silicon nitride film provided on the peripheral edge of the photodiode region is removed in the first embodiment, it may be left without the removal as shown in FIG. 6. In this case, according to the invention, a passage for hydrogen is formed in a very small clearance between silicon nitride 2b and silicon nitride 4b on an interface of a gate oxide film 2 provided under a first layer electrode and a gate oxide film 4 provided under a second layer electrode. Therefore, it is possible to prevent a deterioration in an initial characteristic.

As described above, according to the solid-state image pick-up unit in accordance with the invention, a DC short circuit can be suppressed. Consequently, it is possible to form a solid-state image pick-up unit having a high reliability. Thus, the invention is effective for a solid-state image pick-up unit having a fine electric charge transfer electrode so that an enhancement in a pixel can be expected.

Moreover, the silicon nitride film of the ONO film for the second layer electrode is exactly used as the antireflection film. Therefore, it is possible to simplify the steps.

As described above, according to the solid-state image pick-up unit in accordance with the invention, the pattern edge of the silicon nitride is set to be perpendicular to the surface of the semiconductor substrate in the patterning of the electric charge transfer portion including the gate oxide film having a lamination structure containing the silicon nitride film such as the ONO film. Therefore, it is possible to obtain a solid-state image pick-up unit having a high reliability with high precision in which a leakage can be prevented from being generated.

According to the method of manufacturing a solid-state image pick-up unit in accordance with the invention, moreover, the ONO process is divided for the first layer electrode and the second layer electrode to carry out the formation. Consequently, it is possible to prevent the second layer electrode from entering the edge of the first layer electrode and the generation of a stringer can be suppressed. Thus, it is possible to form a solid-state image pick-up unit having a high reliability with high precision.

The entire disclosure of each and every foreign patent application from which the benefit of foreign priority has been claimed in the present application is incorporated herein by reference, as if fully set forth.

What is claimed is:

1. A solid-state image pick-up unit comprising:
   a semiconductor substrate comprising an area in which a photoelectric converting portion is formed; and
   an electric charge transfer portion that transfers an electric charge formed in the photoelectric converting portion, the electric charge transfer portion being formed in the semiconductor substrate, wherein
   an electric charge transfer electrode for the electric charge transfer portion comprises a first layer electrode and a second layer electrode,
   the second layer electrode is formed to partially overlap with the first layer electrode when viewed from a vertical direction to the surface of the semiconductor substrate so that the second layer electrode is formed on a surface of the semiconductor substrate, a sidewall of the first layer electrode and only a portion of a top surface of the first layer electrode, leaving exposed the remaining portion of the top surface of the first layer electrode and a sidewall of the first layer electrode that is opposed to the sidewall of the first layer electrode on which the second layer electrode is formed,
   a gate oxide film is formed under the first layer electrode and the second layer electrode, the gate oxide film under the second layer electrode comprises a lamination structure (ONO) film which comprises:
      a bottom oxide film of a silicon oxide (SiO) film provided on and in contact with a surface of the semiconductor substrate;
      a silicon nitride (SiN) film formed on and in contact with the bottom oxide film; and
      a top oxide film of a silicon oxide (SiO) film provided on and in contact with the silicon nitride film,
   the gate oxide film under the first layer electrode also comprises a lamination structure (ONO) and covers a surface portion, other than that exposed from the second layer electrode, the ONO film under the first layer electrode includes:
      a bottom oxide film of a silicon oxide (SiO) film provided on and in contact with a surface of the semiconductor substrate;
      a silicon nitride (SiN) film formed on and in contact with the bottom oxide film; and
      a top oxide film of a silicon oxide (SiO) film provided on and in contact with the silicon nitride film,
   the ONO film under the second layer electrode is extended from a region under the second layer electrode that is on the semiconductor substrate to a region between the first layer electrode and the second layer electrode and over which the second layer electrode is formed on the first layer electrode, so as to cover whole of the regions and leaving exposed the remaining portion of the top surface of the first layer electrode and the sidewall of the first layer electrode that is opposed to the sidewall of the first layer electrode on which the second layer electrode is formed, and
   the bottom oxide film of the ONO film under the second layer electrode that is extended contacts a side of the ONO film formed under the first layer electrode, separating the silicon nitride film of the ONO film under the second layer electrode that is extended from the silicon nitride film of the ONO film under the first layer electrode.

2. The solid-state image pick-up unit according to claim 1,
   wherein the ONO film is not formed on a region reaching a surface, on the area in which the photoelectric converting portion is formed, of the semiconductor substrate from an end face of the first layer electrode.

3. The solid-state image pick-up unit according to claim 1,
   wherein the silicon nitride film of the ONO film under the second layer electrode covers a surface, on the area in which the photoelectric converting portion is formed, of the semiconductor substrate, so that the silicon nitride film serves as an antireflection film on the photoelectric converting portion.

4. The solid-state image pick-up unit according to claim 1,
   wherein a shielding film is formed to cover the electric charge transfer portion, and
   a lower end of the shielding film is formed to reach a level which is closer to the surface of the substrate than lower ends of the first and second layer electrodes.

5. The solid-state image pick-up unit according to claim 1,
   wherein the bottom oxide film comprises a thermal oxide film formed on the surface of the semiconductor substrate and subjected to a nitriding treatment.

6. The solid-state image pick-up unit according to claim 1,
   wherein the bottom oxide film comprises:
   a thermal oxide film formed on the surface of the semiconductor substrate and subjected to a nitriding treatment; and
   a CVD oxide film formed on the thermal oxide film.

7. The solid-state image pick-up unit according to claim 5,
   wherein the thermal oxide film subjected to the nitriding treatment has a thickness of 10 nm or less.

8. The solid-state image pick-up unit according to claim 1,
   wherein the bottom oxide film comprises a CVD oxide film comprising nitrogen and formed on the surface of the semiconductor substrate.

9. A method of manufacturing a solid-state image pick-up unit, which forms, on a semiconductor substrate comprising an area in which photoelectric converting portion is formed, an electric charge transfer portion that transfers an electric charge formed by the photoelectric converting portion, the method comprising:

forming gate oxide films of the electric charge transfer portion on the semiconductor substrate, forming gate oxide films including:

sequentially laminating, on a surface of the semiconductor substrate, a bottom oxide film of a silicon oxide (SiO) film formed on and in contact with the semiconductor substrate, a silicon nitride (SiN) film formed on and in contact with the bottom oxide film and a top oxide film of a silicon oxide (SiO) film formed on and in contact with the silicon nitride film, to form a first lamination structure (ONO) film;

forming a first layer conductive film on the first ONO film and patterning the first layer conductive film to form a first layer electrode;

sequentially laminating, on the first layer electrode, a bottom oxide film of a silicon oxide (SiO) film, a silicon nitride (SiN) film formed on the bottom oxide film, and a top oxide film of a silicon oxide (SiO) film provided on the silicon nitride film, to form a second lamination structure (ONO) film, the bottom oxide film of the second ONO film contacts a side of the first ONO film and separates the silicon nitride film of the second ONO film from the silicon nitride film of the first ONO film;

forming a second layer conductive film on the second ONO film and patterning the second layer conductive film, to form a second layer electrode to partially overlap with the first layer electrode when viewed from a vertical direction to the surface of the semiconductor substrate so that the second layer electrode is formed on a surface of the semiconductor substrate, a sidewall of the first layer electrode and only a portion of a top surface of the first layer electrode, leaving exposed the remaining portion of the top surface of the first layer electrode and a sidewall of the first layer electrode that is opposed to the sidewall of the first layer electrode on which the second layer electrode is formed, and selectively removing the second ONO film after the step of forming the second layer electrode so that the second ONO film is extended from a region under the second layer electrode that is on the semiconductor substrate to a region between the first layer electrode and the second layer electrode and over which the second layer electrode is formed on the first layer electrode, so as to cover whole of the regions and leaving exposed the remaining portion of the top surface of the first layer electrode and the sidewall of the first layer electrode that is opposed to the sidewall of the first layer electrode on which the second layer electrode is formed.

10. The method of manufacturing a solid-state image pick-up unit according to claim 9, wherein selective removing further comprises removing the second ONO film so as to remain at least the silicon nitride film of the second ONO film on a surface, on the area in which the photoelectric converting portion is formed, of the semiconductor substrate.

11. The method of manufacturing a solid-state image pick-up unit according to claim 9, wherein selective removing further comprises:

removing the second ONO film along a peripheral edge of a surface, on the area in which the photoelectric converting portion is formed, of the semiconductor substrate; and forming a shielding film to enter the peripheral edge from which the second ONO film is removed.

12. The method of manufacturing a solid-state image pick-up unit according to claim 9, wherein forming the bottom oxide film comprises:

forming a silicon oxide film; and annealing the silicon oxide film in an atmosphere containing nitrogen to form an oxynitride film.

13. The method of manufacturing a solid-state image pick-up unit according to claim 12, wherein forming a silicon oxide film includes thermal oxidizing.

14. The method of manufacturing a solid-state image pick-up unit according to claim 12, wherein forming a silicon oxide film comprises forming a silicon oxide film by a CVD method.

15. The method of manufacturing a solid-state image pick-up unit according to claim 12, wherein forming a silicon oxide film comprises forming a silicon oxide film by a thermal oxidation, carrying out annealing in an atmosphere containing nitrogen, and then forming a silicon oxide film by a CVD method.

* * * * *